(12) United States Patent
Ootani

(10) Patent No.: US 7,514,307 B2
(45) Date of Patent: Apr. 7, 2009

(54) METHOD OF MANUFACTURING A SEMICONDUCTOR APPARATUS

(75) Inventor: Kinya Ootani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 181 days.

(21) Appl. No.: 11/580,035

(22) Filed: Oct. 13, 2006

(65) Prior Publication Data

US 2007/0087494 A1 Apr. 19, 2007

(30) Foreign Application Priority Data

Oct. 18, 2005 (JP) ............................ 2005-302668

(51) Int. Cl.
*H01L 21/00* (2006.01)
(52) U.S. Cl. .................... 438/197; 438/586; 438/307
(58) Field of Classification Search ................ 438/307, 438/586, 197
See application file for complete search history.

(56) References Cited

U.S. PATENT DOCUMENTS

| 5,795,793 | A * | 8/1998 | Kinzer ........................ 438/307 |
| 6,531,356 | B1 * | 3/2003 | Hayashi ....................... 438/228 |
| 6,713,325 | B2 * | 3/2004 | Wake et al. .................. 438/149 |
| 6,787,849 | B2 * | 9/2004 | Hayashi ....................... 257/344 |
| 2003/0129792 | A1 * | 7/2003 | Wake et al. .................. 438/199 |
| 2003/0141552 | A1 * | 7/2003 | Hayashi ....................... 257/371 |
| 2004/0191967 | A1 * | 9/2004 | Wake et al. .................. 438/149 |
| 2007/0087494 | A1 * | 4/2007 | Ootani ........................ 438/197 |
| 2007/0254426 | A1 * | 11/2007 | Wake et al. .................. 438/225 |
| 2008/0179648 | A1 * | 7/2008 | Ha et al. ...................... 257/296 |

FOREIGN PATENT DOCUMENTS

| JP | 60-021571 | 2/1985 |
| JP | 64-080078 | 3/1989 |
| JP | 2756826 | 3/1998 |
| JP | 10-505198 | 5/1998 |
| JP | 2004-031721 | 1/2004 |
| JP | 2004-522305 | 7/2004 |
| WO | WO 02/089195 A2 | 7/2002 |

* cited by examiner

*Primary Examiner*—Laura M Menz
(74) *Attorney, Agent, or Firm*—McGinn IP Law Group, PLLC

(57) ABSTRACT

A method of manufacturing a semiconductor apparatus of the present invention comprises forming body diffusion layer, a gate electrode, and an interlayer dielectric over an surface of a semiconductor substrate, forming a photoresist having an opening in a region overlapping with a part of the body diffusion layer, removing the interlayer dielectric to form an opening using the photoresist as a mask, forming a body contact diffusion layer by implanting ion in the opening of the interlayer dielectric using the photoresist as a mask, forming a source contact by removing neighboring portion of the opening of the interlayer dielectric using the photoresist as a mask after the body contact diffusion layer 13 is formed, and removing the photoresist.

19 Claims, 15 Drawing Sheets

METHOD OF MANUFACTURING A SEMICONDUCTOR APPARATUS

BACKGROUND OF THE INVENTION

1. Field of the Invention

The present invention relates to a manufacturing method of a semiconductor apparatus.

2. Description of Related Art

A vertical power MOSFET for applying a current vertically to a surface of a semiconductor substrate is widely known as a MOSFET (Metal-Oxide Semiconductor Field Effect Transistor) for high pressure. Demands for such a power MOSFET has been increasing in recent years along with rapid expansion of mobile device and advance in communication technology. Further, a technology to reduce manufacturing cost of a power MOSFET without affecting a performance of the power MOSFET is desired.

Examples of gate structures of a vertical power MOSFET includes a planar gate structure whereby a planar gate electrode is provided over a surface of a semiconductor substrate, and a trench gate structure whereby a gate electrode is provided in a trench vertical to the surface of the semiconductor substrate.

A manufacturing method of a power MOSFET having a planar gate structure is disclosed in Japanese Unexamined Patent Application Publication No. 2004-31721, for example. A manufacturing method of a conventional semiconductor apparatus disclosed in Japanese Unexamined Patent Application Publication No. 2004-31721 is described hereinafter with reference to FIGS. 10 to 14. FIGS. 10, 11, 13, and 14 are cross-sectional diagrams showing a conventional semiconductor apparatus. FIG. 12 is a plan view showing the conventional semiconductor apparatus of FIG. 11. That is, FIG. 11 is a cross-sectional diagram taken along the line A-A of FIG. 12.

As shown in FIG. 10, a body region 81 is selectively formed over the semiconductor substrate 80. A gate oxidation film 84 and a gate electrode 85 are formed over the semiconductor substrate 80 and the body region 81. Then an interlayer dielectric 86 is formed to cover all the surface of the gate oxidation film 84 and the gate electrode 85.

After that as shown in FIG. 11, a body contact 88 is formed for electrically connecting the body region 81 and the electrode. At this time, a photoresist 90 is formed on the interlayer dielectric 86, and the photoresist 90 is patterned so that the photoresist 90 over the body contact 88 is opened. An etching is performed using the photoresist 90 as a mask, and the interlayer 86 and the gate oxidation film 84 are removed to expose a central part of the body region 81 to form the body contact 88.

Then as shown in FIG. 13, the photoresist 90 on the interlayer dielectric 86 is removed. After that as shown in FIG. 14, a source contact 87 is formed for electrically connecting a source region 82 formed in the body region 81. At this time, an etching is performed over all the surface of the semiconductor apparatus to remove the interlayer dielectric 86 and the gate oxidation film 84 so as to extend the exposed portion of the body region 81. Then the source contact 87 is formed. The semiconductor apparatus is treated with heat, and a body contact region 83 and a source region 82 are formed.

A manufacturing method of a power MOSFET having trench gate structure is disclosed in Japanese Patent Translation Publication No. 2004-522305. The technique disclosed in Japanese Patent Translation Publication No. 2004-522305 etches over all the surface of the semiconductor apparatus as with FIG. 11 to form a source contact.

A relationship between a semiconductor apparatus and bonding force is described in Japanese Patent No. 2756826. As shown in FIG. 15 (the same as the FIG. 1 of Japanese Patent No. 2756826), an electrode over the semiconductor apparatus is bonded with wire in a general power MOSFET. In FIG. 15, a source electrode 81 is formed to contact the source region 82 via a source contact. The source electrode 91 is also used as a bonding pad. An interlayer dielectric 86 may be destroyed in case a bonding wire is bonded to one face of the bonding pad. A thickness of the interlayer dielectric 86 must be thick enough to prevent from being destroyed as at FIG. 14.

Another conventional method of manufacturing a power MOSFET is disclosed in Japanese Patent Translation Publication No. 10-505198. The technique disclosed in Japanese Patent Translation Publication No. 10-505198 implants ion before an interlayer dielectric is formed so that a body contact and source regions are laminated over a surface of a body region. When the interlayer dielectric is etched, source region over the body contact region is removed so as to expose the body contact region. Accordingly with this technique disclosed in Japanese Patent Translation Publication No. 10-505198, a depth of the etching must be deeper in order to form the body contact. Furthermore in Japanese Patent Translation Publication No. 10-505198, the body contact region is formed extending underneath of the gate electrode so that the body contact region overlap with the gate electrode. The under part of the gate electrode is to be a channel region while a MOSFET is operating. In case a high-density body contact region is formed under part of the gate electrode, a threshold of the MOSFET increases, thereby influencing characteristics of the MOSFET.

With the conventional manufacturing method of a semiconductor apparatus illustrated in FIGS. 10 to 14, a source contact is formed by performing an etching over all the surface of the semiconductor apparatus after that photoresist used for forming a body contact is removed. It has now been discovered that with the conventional manufacturing method of a semiconductor apparatus, a thickness of an entire interlayer dielectric decreases along with a removal of the gate oxidation film and the interlayer dielectric which corresponds the area to be the source contact.

In order to prevent the interlayer dielectric from destroying due to its decreased thickness, the interlayer dielectric must be formed thicker in advance. This could require a plurality of forming processes of insulating films, thereby increasing manufacturing cost. Accordingly the thickness of the interlayer dielectric 86 must be thick enough in light of the decrease of it's thickness at the end (such as the film thickness of the interlayer dielectric 86 as at FIG. 14). Further, with considerations of fluctuations in thickness and etching, initial thickness needs to be thick enough to some extent.

Especially in case a thick wire is used to be bonded for a large current, power in bonding becomes enormous, resulting to destroy an interlayer dielectric. In this case, the initial thickness of the interlayer dielectric 86 may need to be for example 2000 nm, which is exceedingly thick. Interlayer dielectric having a thickness of 200 nm cannot be formed in a single process and requires two processes (forming 1000 nm films twice).

SUMMARY OF THE INVENTION

According to an aspect of the present invention, there is provided a method of manufacturing a semiconductor apparatus that comprises forming a low-density body region of a second conductivity type in a surface of a semiconductor substrate of a first conductivity type, forming a source region of the first conductivity type in the body region, forming a gate electrode adjacent to the body region via a gate insulating film, forming an interlayer dielectric over the body region and the gate electrode, forming a mask pattern over the interlayer dielectric, forming an opening in the interlayer dielectric using the mask pattern as a mask, implanting ion to a region of the body region using them ask pattern as a mask to form a high-density body contact region of the second conductivity type, and removing the interlayer dielectric to extend the opening of the interlayer dielectric using the mask pattern as a mask to form a source contact, wherein the surface of the source region and the surface of the body contact region match with the substantially coplanar surface of the semiconductor substrate.

The manufacturing method of the semiconductor apparatus prevents a thickness of the interlayer dielectric being decreased because mask pattern used in forming the body contact region is used to form the source contact.

The present invention provides a method of manufacturing a semiconductor apparatus that is capable of preventing to decrease a thickness of an interlayer dielectric in forming a source contact.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A first embodiment of the present invention and a manufacturing method thereof is described hereinafter in detail.

A configuration of a semiconductor apparatus according to the present invention is described hereinafter with reference to FIG. 1. A semiconductor apparatus 1 is a vertical power MOSFET for high pressure, with planar gate structure. In the explanation below the semiconductor apparatus 1 is explained as an N-channel MOSFET. However a conductivity type of the semiconductor may be P-channel MOSFET.

Figure 1:
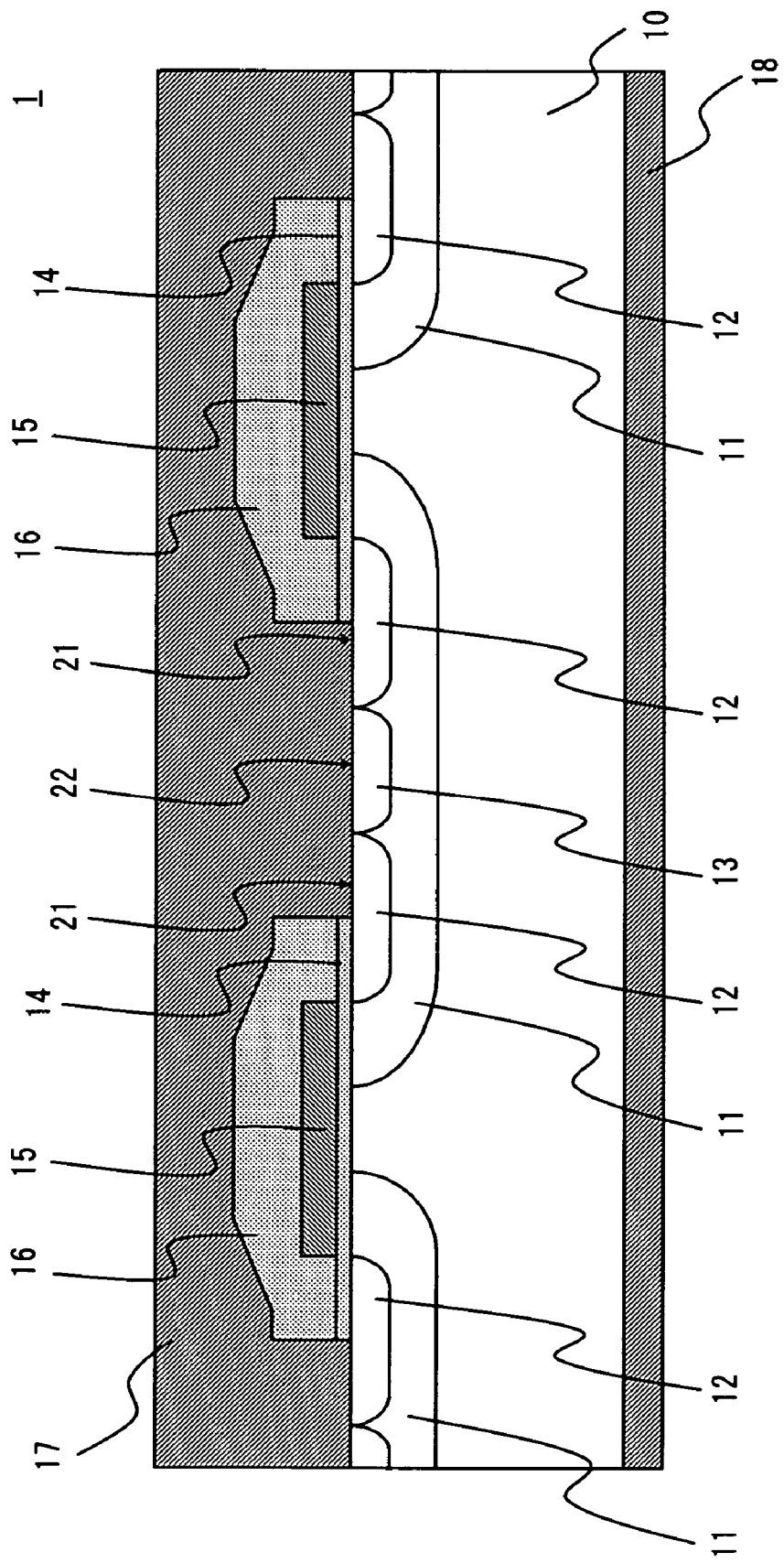
FIG. 1 is a cross-sectional diagram showing a configuration of a semiconductor apparatus according to the present invention.

As shown in FIG. 1, the semiconductor apparatus 1 includes a semiconductor substrate 10. The semiconductor substrate 10 is an N-type high-density semiconductor substrate such as silicon substrate. An epitaxial layer is formed all over the surface of the semiconductor substrate 10, which is not shown. The epitaxial layer is an N-type low-density semiconductor layer having lower impurity concentration as compared to the semiconductor substrate 10. The semiconductor substrate 10 (including the epitaxial layer) operates as a drain of a MOSFET.

A body diffusion layer 11 is formed in the semiconductor substrate 10. The body diffusion layer (body region) 11 is a P-type low-density semiconductor region. While the MOSFET is operating, the body diffusion layer (body region) 11 becomes a channel region (region where a channel is formed) formed near a gate electrode 15.

A source diffusion layer (source region) 12 is formed on the surface of the body diffusion layer 11. The source diffusion layer (source region) 12 is formed around the central part of the body diffusion layer 11. Specifically, the source diffusion layer (source region) 12 is formed in the area that extends from side end part of the gate electrode 15 and has a specified width.

The source diffusion layer 12 is an N-type high-density semiconductor region. The source diffusion layer 12 operates as a source of the MOSFET. A source contact 21 is formed on a surface of the source diffusion layer 12. The source contact 21 does not overlap with an interlayer dielectric 16 but is exposed from the interlayer dielectric 16. To be specific, the source contact 21 is the surface of the source diffusion layer 12 and is a portion that contacts a source electrode.

The source contact 21 is formed by removing a part of the interlayer dielectric 16 that covers a region to be the source diffusion layer 12 so as to form a source electrode.

A body contact diffusion layer (body contact region) 13 is formed on a central region of a surface of the body diffusion layer 11 (a region where the source diffusion layer 12 is not formed). In other words, the body contact diffusion layer 13 is formed in between the source diffusion layer 12.

The body contact diffusion layer 13 has no influence on forming a channel because the body contact diffusion layer 13 is not formed below and near the gate electrode 15. The body contact diffusion layer 13 is a P-type high-density semiconductor region. A body contact 22 is a surface of the body contact diffusion layer 13 and contacts an external body electrode (not shown). The body contact 22 is formed by removing a part of the interlayer dielectric 16 that covers a region to be the body diffusion layer 13 so as to form a body electrode.

The gate electrode 15 is formed in between the body diffusion layer 11 over the semiconductor substrate 10 via a gate oxide film (gate insulating film) 14. The gate electrode 15 is structured to be planar and placed adjacent to the body diffusion layer 11. A size of the gate oxide film 16 is the same as the interlayer dielectric 16 in a planar view.

The interlayer dielectric 16 is formed to cover over the gate electrode 15 and a part of the source diffusion layer 12 on the gate electrode 15. Although not shown in the drawings, a contact hole is formed in the interlayer dielectric 16 so as to pull out the gate electrode 15.

A source electrode 17 is formed over the source diffusion layer 12, the body contact diffusion layer 13, and the interlayer dielectric 16. The source electrode 17 is electrically connected to the source diffusion layer 12 via the source contact 21.

A drain electrode 18 is formed over one surface of the semiconductor substrate 10. The drain electrode 18 is formed over an opposite surface (rear face) to a surface where the gate electrode 15 (source electrode 17) is formed.

In case a voltage more than a threshold is applied between the gate electrode 15 and the source electrode 17, a channel region is formed in the body diffusion layer 11 near the gate electrode 15. Then a charge moves from the source diffusion layer 12 towards the semiconductor substrate 10. A current flows from the drain electrode 18 to the source electrode 17.

Figure 4:
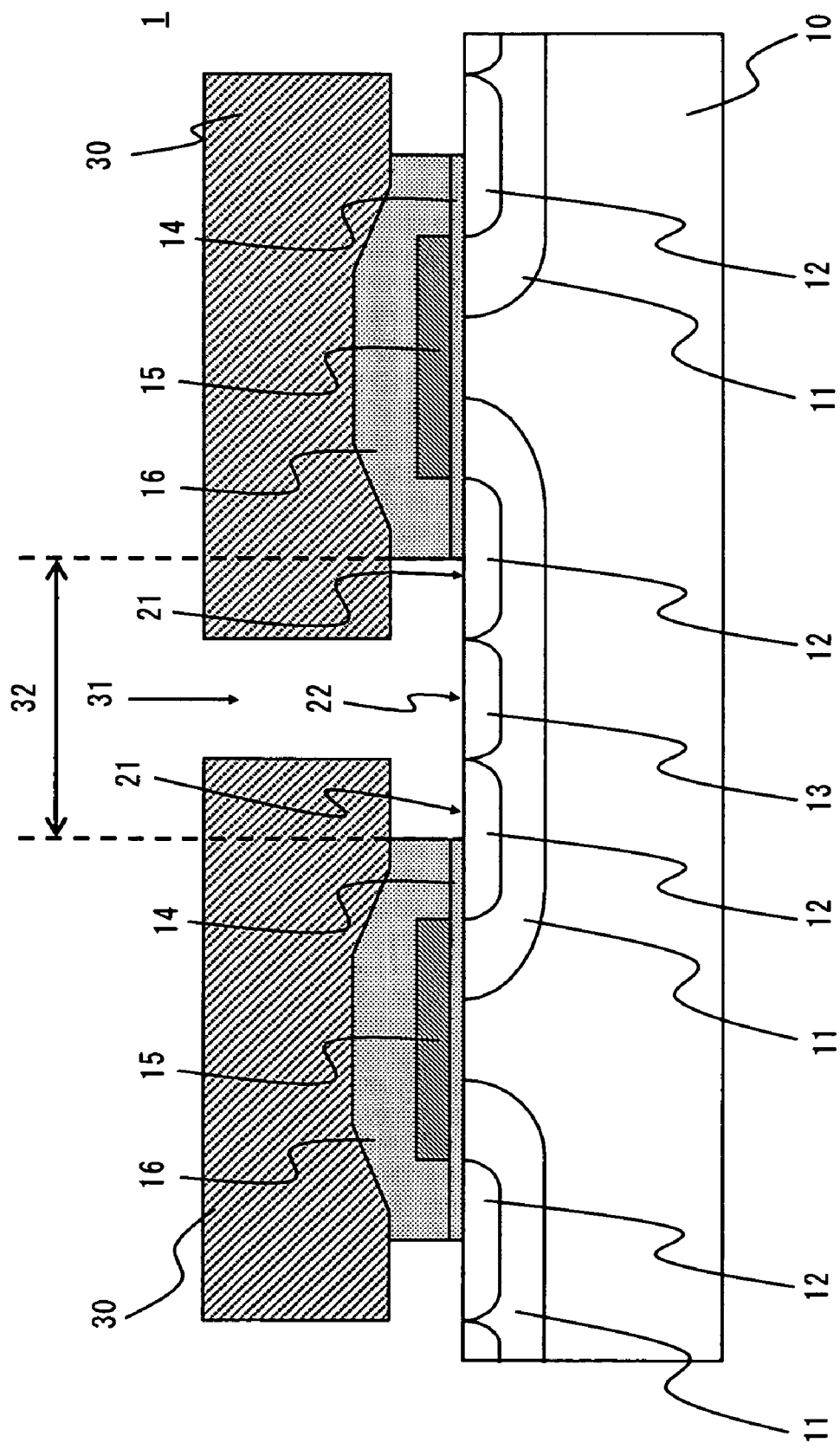
FIG. 4 is a cross-sectional diagram for explaining a manufacturing method of the semiconductor apparatus according to the present invention.
Figure 5:
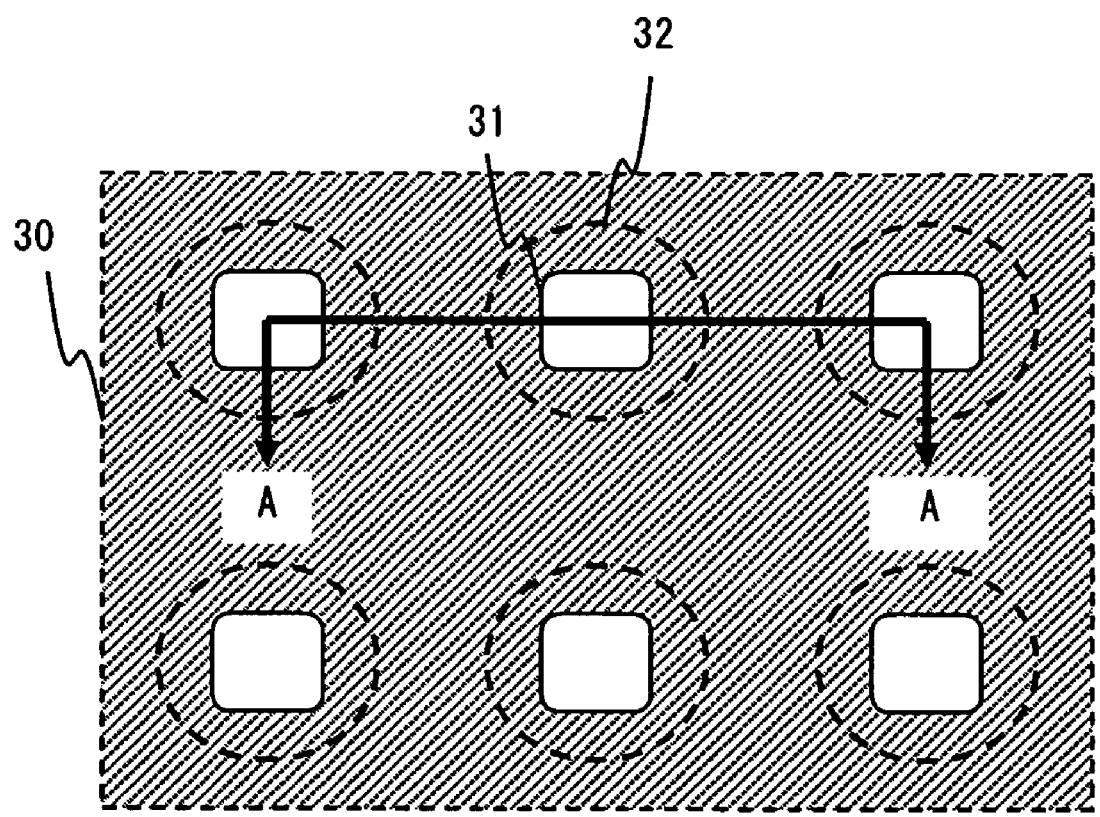
FIG. 5 is a plan view for explaining a manufacturing method of the semiconductor apparatus according to the present invention.

A method of manufacturing a semiconductor apparatus of this embodiment is described hereinafter in detail with reference to FIGS. 2 to 6. FIGS. 2 to 4 and 6 are cross-sectional diagrams showing a semiconductor apparatus. FIG. 5 is a plan view of the semiconductor apparatus of FIG. 4. FIG. 4 is a cross-sectional diagram taken along the line A-A of FIG. 5.

Figure 2:
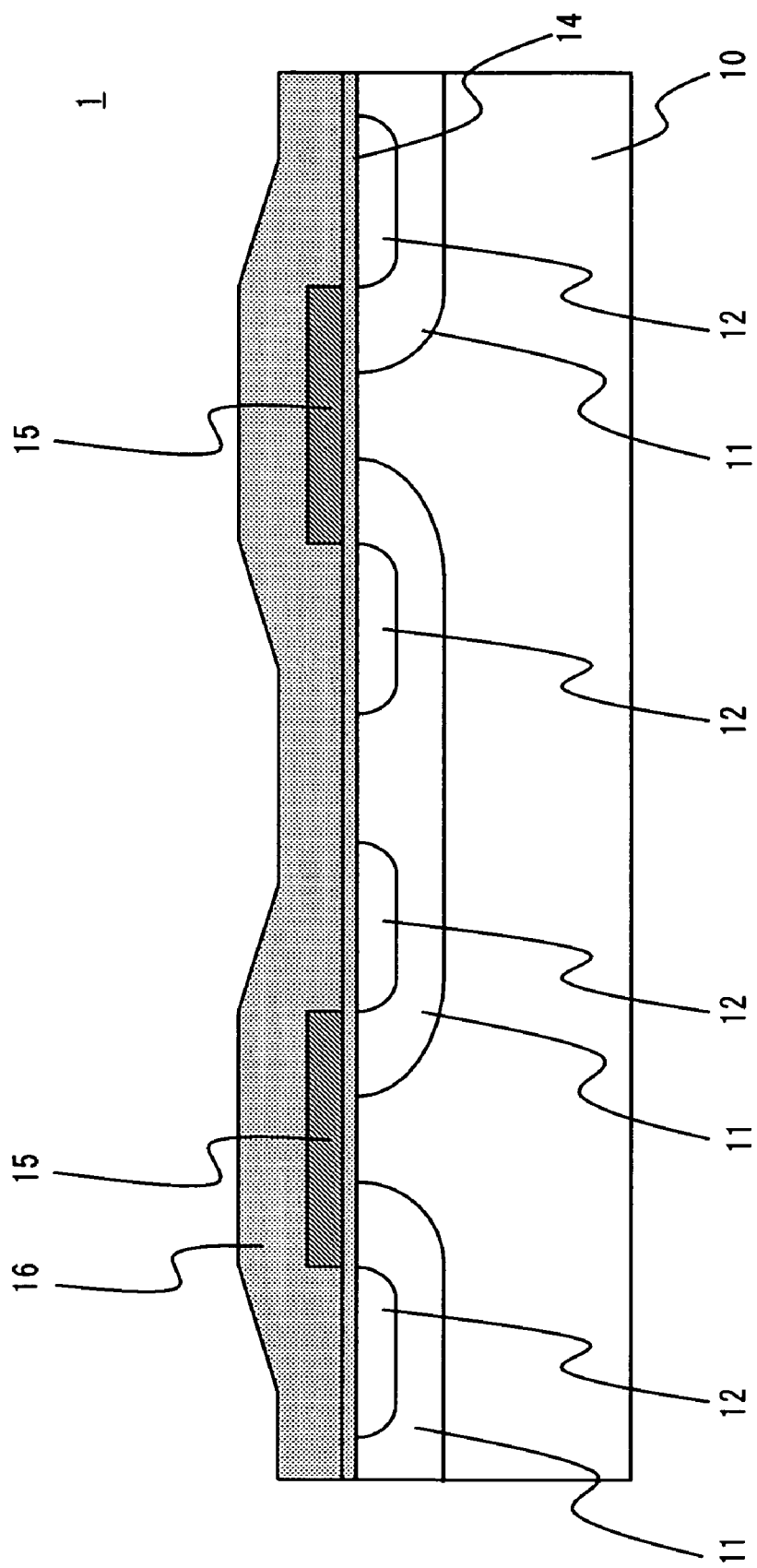
FIG. 2 is a cross-sectional diagram for explaining a manufacturing method of the semiconductor apparatus according to the present invention.

As with FIG. 2, an epitaxial layer (not shown) is formed over the semiconductor substrate 10. Then the gate oxide film 14 is formed by thermal oxidation method on the surface of the semiconductor substrate 10. After that, a polysilicon is formed by CVD method over the surface of the semiconductor substrate 10. High-density impurity (phosphorus) is implanted, heat treatment is applied, and a resist mask is formed by photolithography method. Then unnecessary polysilicon is etched to selectively leave polysilicon so as to form the gate electrode 15. After that, boron ion is implanted from the surface of the semiconductor substrate 10 using the polysilicon to be the gate electrode 15 as a mask, heat treatment is applied, and the body diffusion layer 11 is formed. Then a resist mask is formed by photolithography method, arsenic ion is implanted around the body diffusion layer 11, heat treatment is applied so as to form the source diffusion layer 12. Further, a silicon oxidation film is formed by CVD method so as to form the interlayer dielectric 16 over all the surface of the semiconductor substrate 10 to cover the gate electrode 15 and the gate oxidation film 14.

Figure 3:
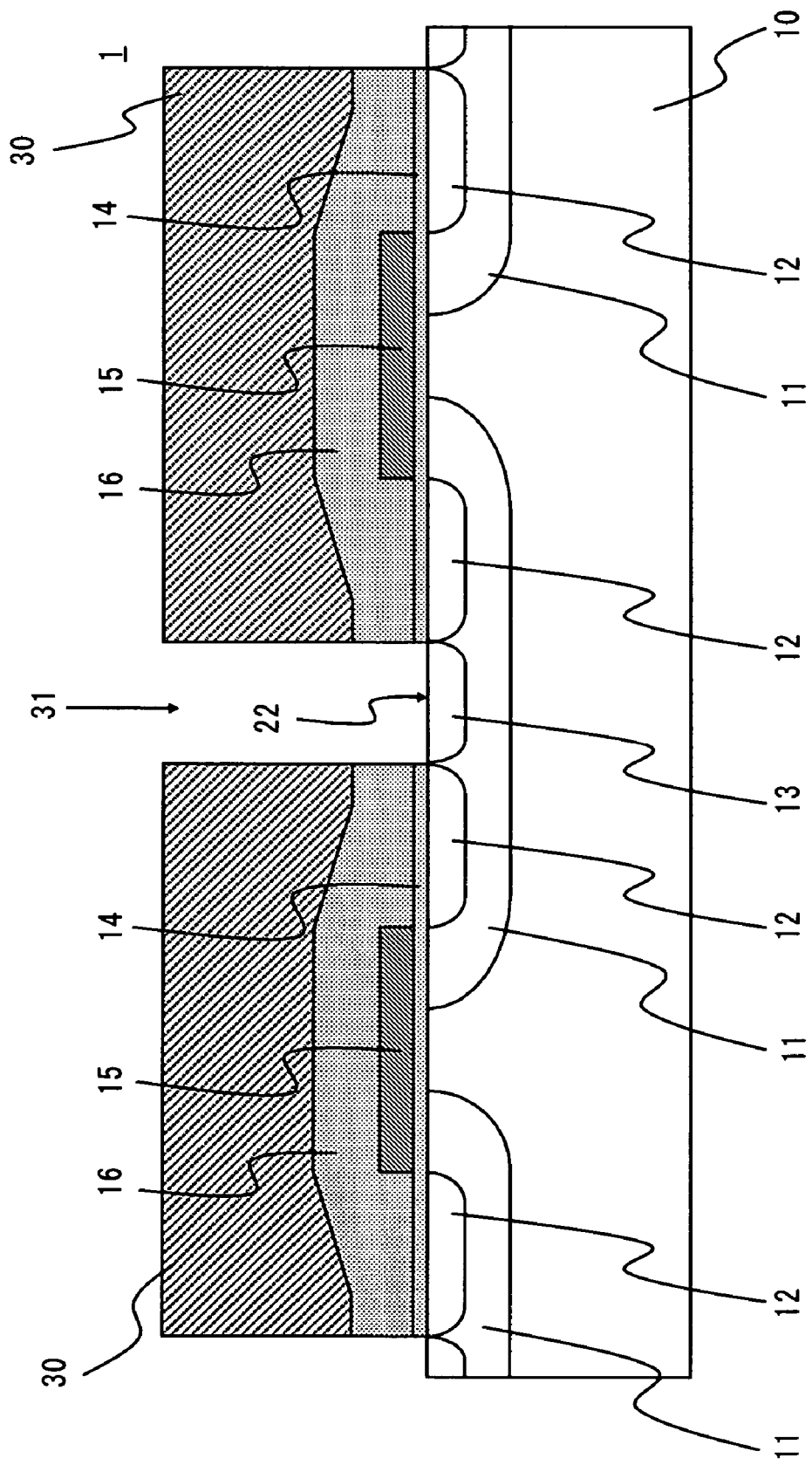
FIG. 3 is a cross-sectional diagram for explaining a manufacturing method of the semiconductor apparatus according to the present invention.

After that as shown in FIG. 3, the interlayer dielectric 16 is patterned by using photolithography and dry etching methods. At this time, a photoresist (mask pattern) 30 is formed on the interlayer dielectric 16. Then the photoresist 30 is patterned so as to form an opening 31. The body contact 22 is formed in a portion corresponds the opening 31. After that, an anisotropic etching is performed from the opening 31 using the photoresist 30 as a mask so that the interlayer dielectric 16 and the gate oxidation film 14 over a central part of the body diffusion layer 11 are removed to expose the body diffusion layer 11. Then a region to be the body contact 22 is formed. Further, boron ion is implanted from the opening 31 using the photoresist 30 as a mask, heat treatment is applied so as to form the body contact diffusion layer 13. By implanting ion using the photoresist 30 as a mask, the body contact diffusion layer 13 can be formed only on the central part of the body diffusion layer, being kept away from the gate electrode 15.

After that as shown in FIG. 4, an isotropic etching is performed from the opening 31 using the photoresist 30 as a mask. This pulls back the interlayer dielectric 16 and the gate oxidation film 15 towards the gate electrode 15 to expose a part of the source diffusion layer 12. Then the source contact 21 is formed. At this time as shown in FIG. 5, an etching is performed so that an opening region 32 of the interlayer dielectric 16 and the gate oxide film to be wider than the opening 31 of the photoresist 30. In this etching process, only the interlayer dielectric 16 and the gate oxidation film 14 need to be removed and the source diffusion layer 12, the body contact diffusion layer 13, and the body diffusion layer 11 need not to be removed.

Figure 6:
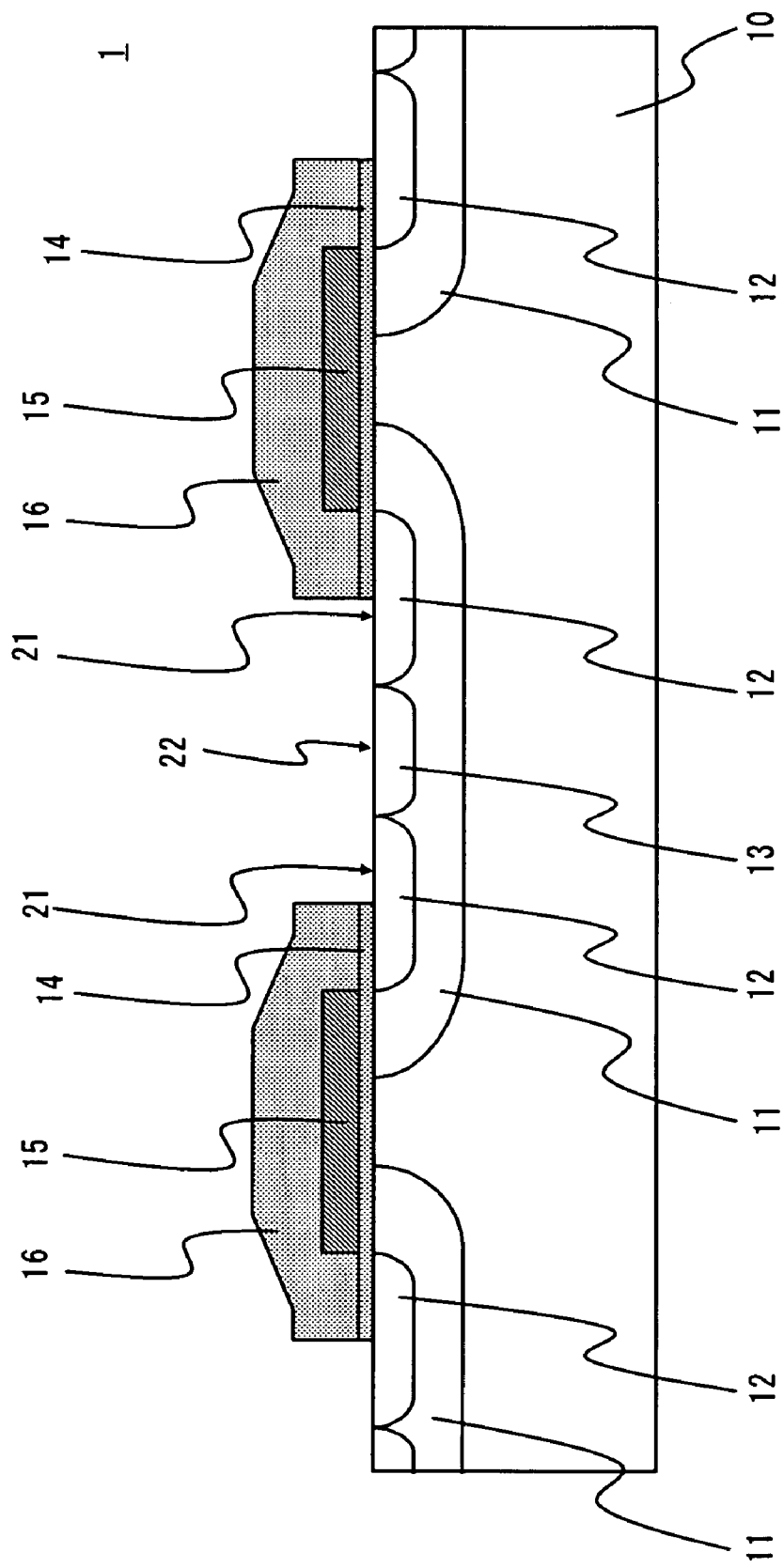
FIG. 6 is a cross-sectional diagram for explaining a manufacturing method of the semiconductor apparatus according to the present invention.

Then as shown in FIG. 6, the photoresist 30 is removed by ashing. At this time, a thickness of the interlayer dielectric 16 does not change because only the photoresist 30 is removed. Then an aluminum film is formed by sputter method over the surface of the semiconductor substrate 10. After that, the aluminum film is patterned by photolithography and dry etching methods to form the source electrode 17. Then the drain electrode 18 is formed over the rear face of the semiconductor substrate 10. The semiconductor apparatus 1 of FIG. 1 is completed.

In this embodiment as with FIG. 4 explained above, the photoresist 30 over the interlayer dielectric 16 used in forming the body contact 22 is not removed but used as a mask to perform a side etching so as to form the source contact 21. The thickness of the interlayer dielectric 16 does not decrease as a result of the etching process because it is covered by the photoresist 30. Therefore, the interlayer dielectric 16 remains over the gate electrode 15 with its thickness being the same since initially formed as at the time of FIG. 6. As described in the foregoing, it is not necessary to form the interlayer dielectric to be thicker in light of the decrease in film thickness as in a conventional technique, because the thickness of interlayer dielectric 16 does not decrease. Furthermore a plurality of forming processes required due to restrictions of a manufacturing apparatus is not needed to form a thicker film.

The present invention facilitates to form the interlayer dielectric 16 to be thick enough to prevent from being destroyed by a force applied by bonding, thereby enabling to avoid failure such as short. In other words, the initial thickness of the interlayer dielectric 16 should be thick enough to withstand the force applied by bonding. The decrease in film thickness does not need to be considered accordingly. Further, a plurality of processes is not required considering a decrease in film thickness, thereby reducing manufacturing cost.

Furthermore, this embodiment enables to ignore the decrease in film thickness of the interlayer dielectric 16 over the gate electrode. Therefore a region of the source contact (area contacting the source electrode) by an isotropic etching can be expanded. This reduces a contact resistance between the source diffusion layer 12 and the source electrode 17.

Further as shown in FIG. 3 explained above, an etching is performed using the photoresist mask 30 as a mask to form the body contact 22, and an ion is implanted for the body contact diffusion layer 13 using the photoresist 30 as a mask. Accordingly the body contact diffusion layer does not overlap nor formed near the gate electrode. Therefore, the body contact diffusion layer does not influence a formation of channel and characteristics such as MOSFET threshold.

Second Embodiment

A semiconductor apparatus and a manufacturing method thereof according to a second embodiment of the present invention are described hereinafter in detail.

Figure 7:
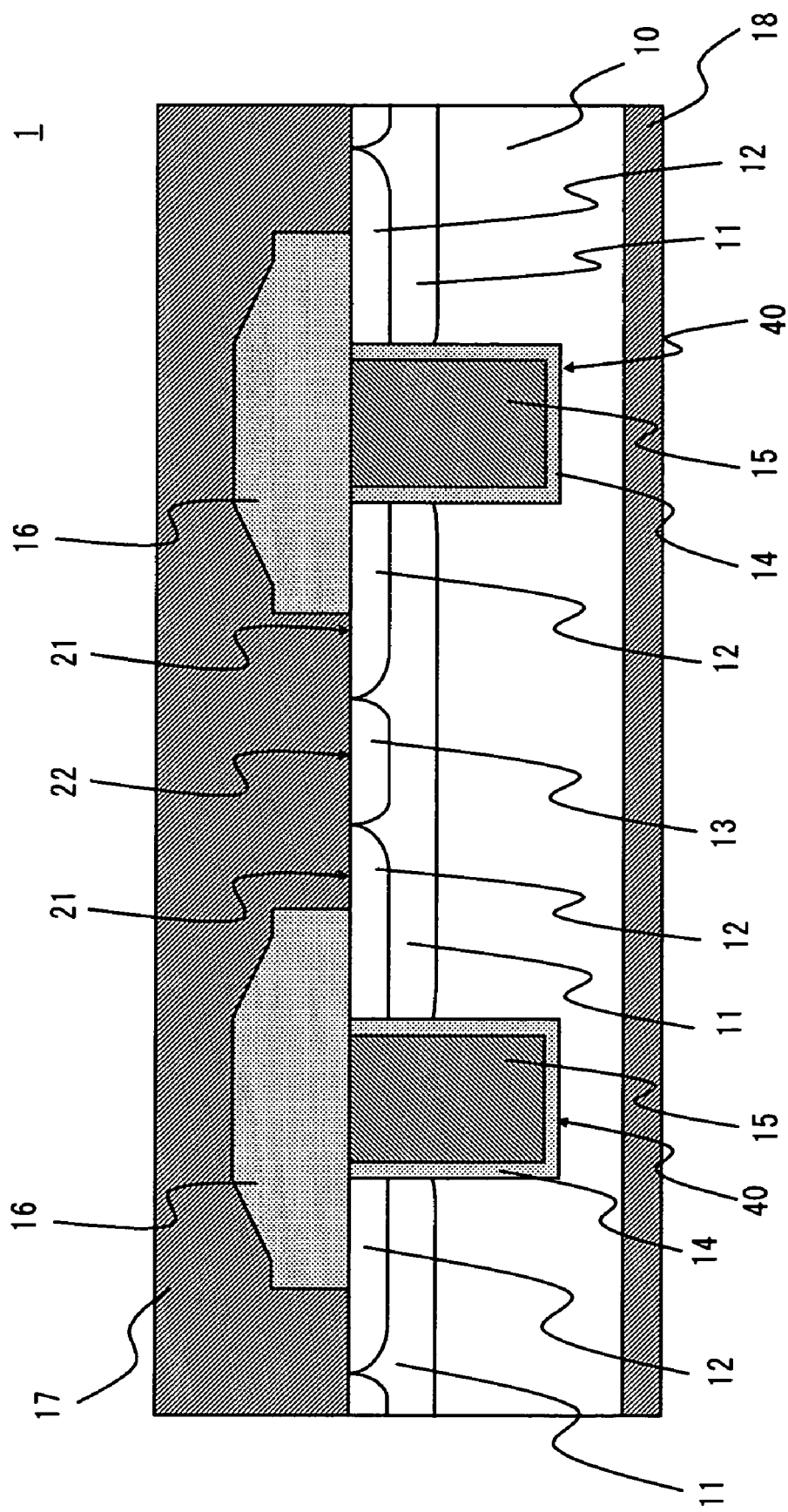
FIG. 7 is a cross-sectional diagram showing a configuration of the semiconductor apparatus according to the present invention.

FIG. 7 is a cross-sectional diagram showing a configuration of a semiconductor apparatus according to this embodiment. The semiconductor apparatus 1 is a vertical power MOSFET having a trench gate structure. In FIG. 7, components identical to those in FIG. 1 are denoted by reference numerals identical to those therein. Components in the second embodiment are identical except for the structure of gate electrode.

A trench 40 formed to penetrate the source diffusion layer 11 and the body diffusion layer 11 from the surface of the semiconductor substrate 10 to reach the semiconductor substrate 10. The gate oxidation film 14 is formed to coat inner surface of the trench 40. The gate electrode 15 is filled in the trench 40 up to an opening of the trench 40.

Figure 8:
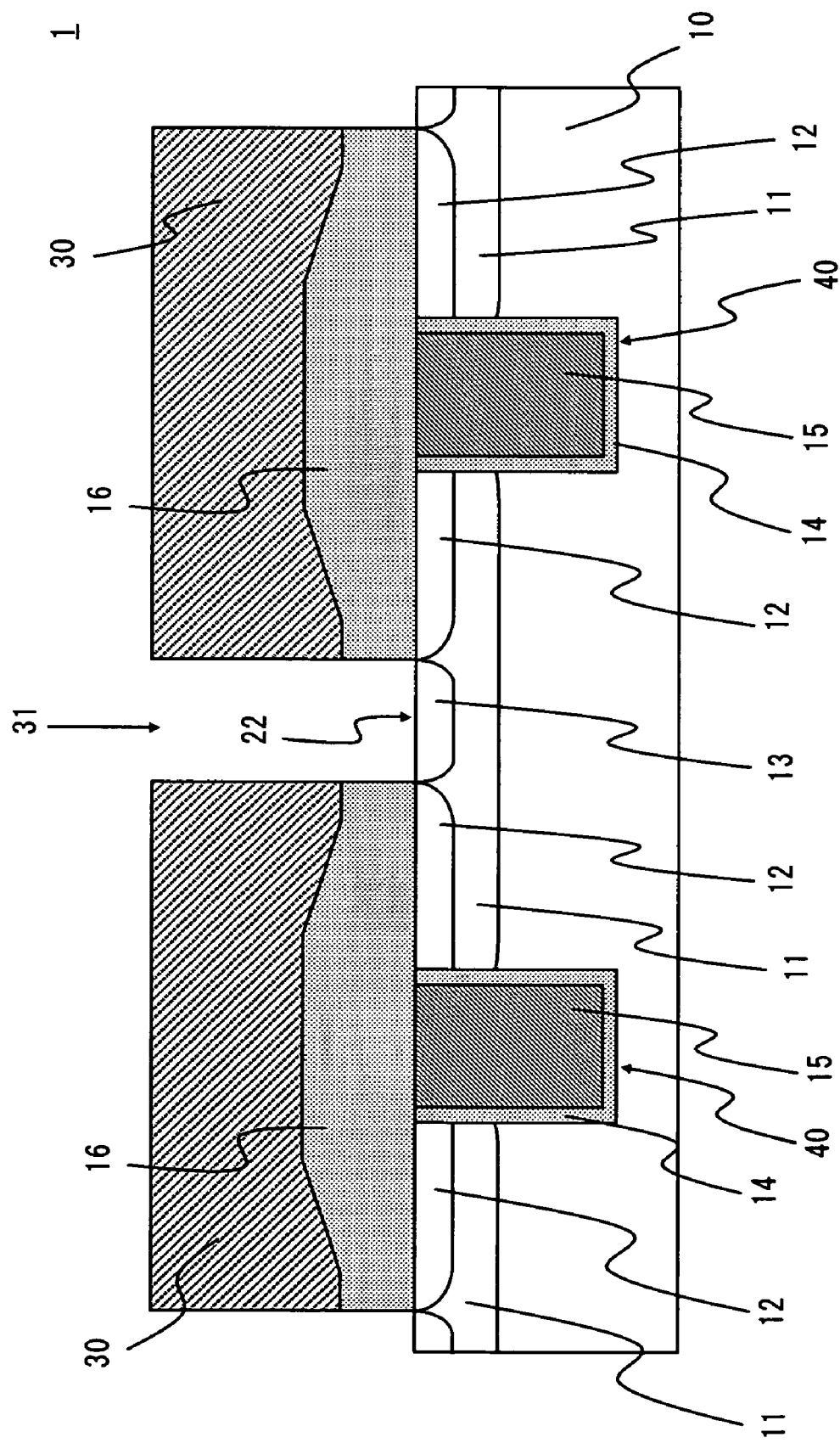
FIG. 8 is a cross-sectional diagram for explaining a manufacturing method of the semiconductor apparatus according to the present invention.
Figure 9:
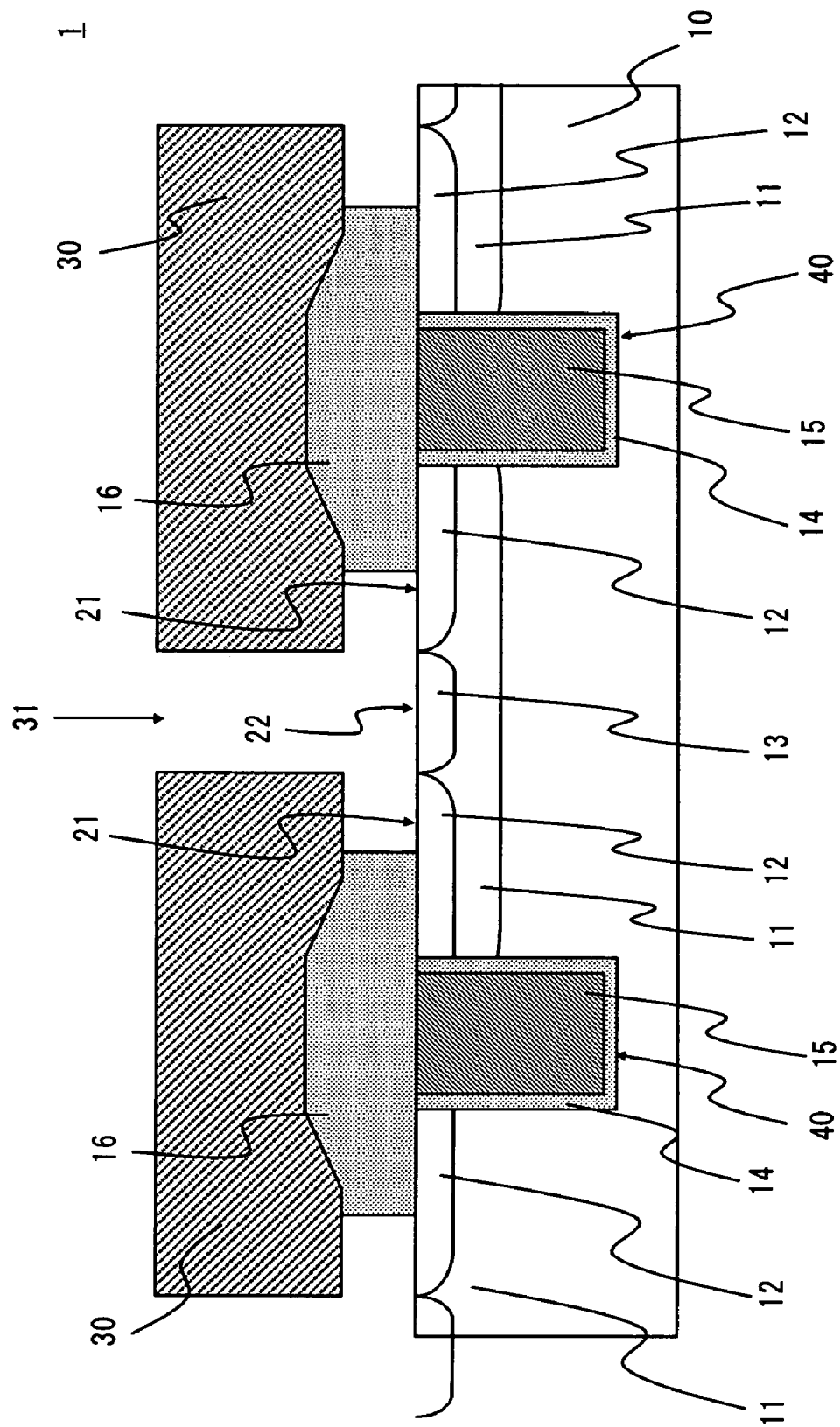
FIG. 9 is a cross-sectional diagram for explaining a manufacturing method of the semiconductor apparatus according to the present invention.
Figure 10:
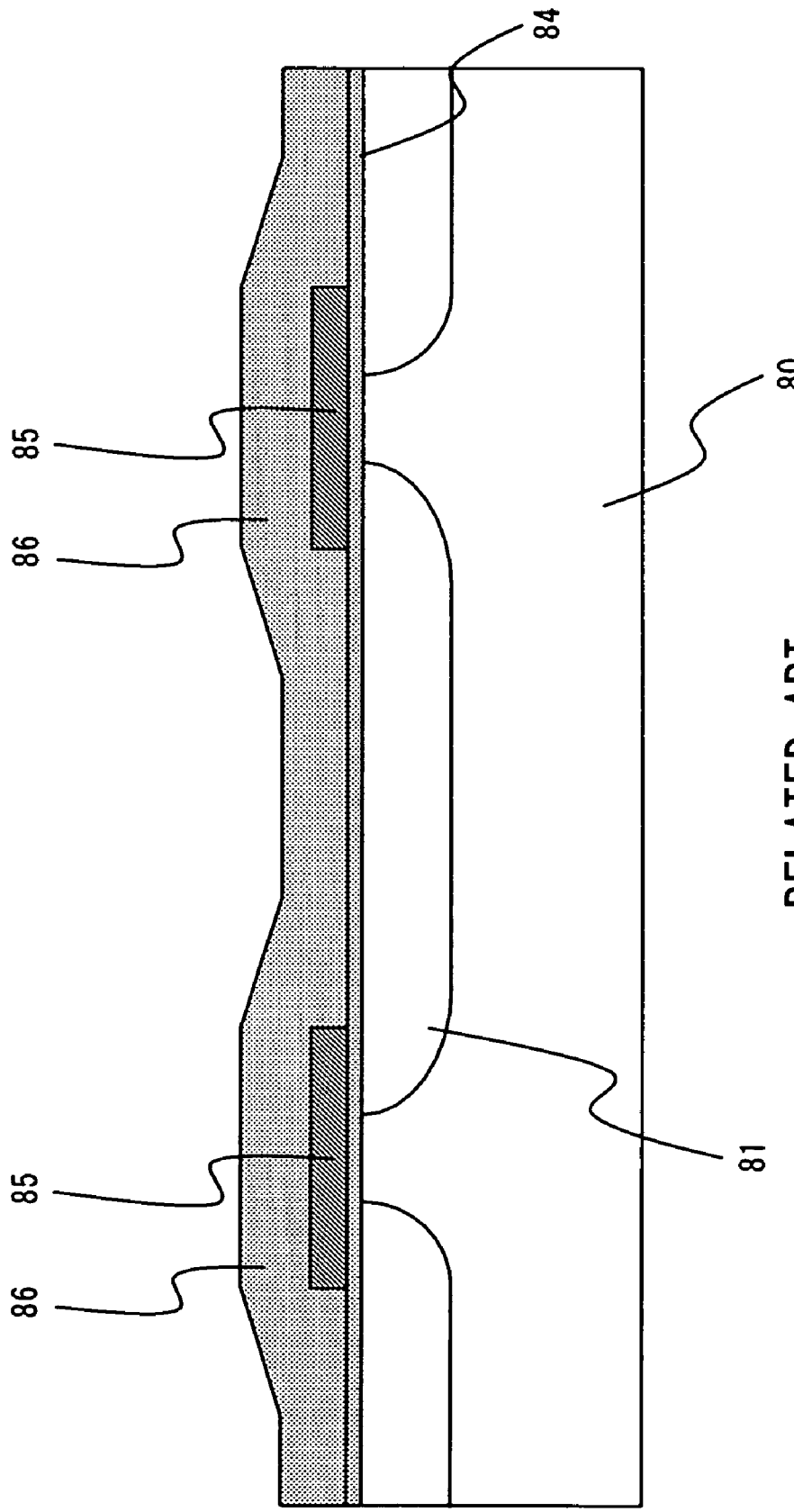
FIG. 10 is a cross-sectional diagram for explaining a manufacturing method of the semiconductor apparatus according to a conventional technique.
Figure 11:
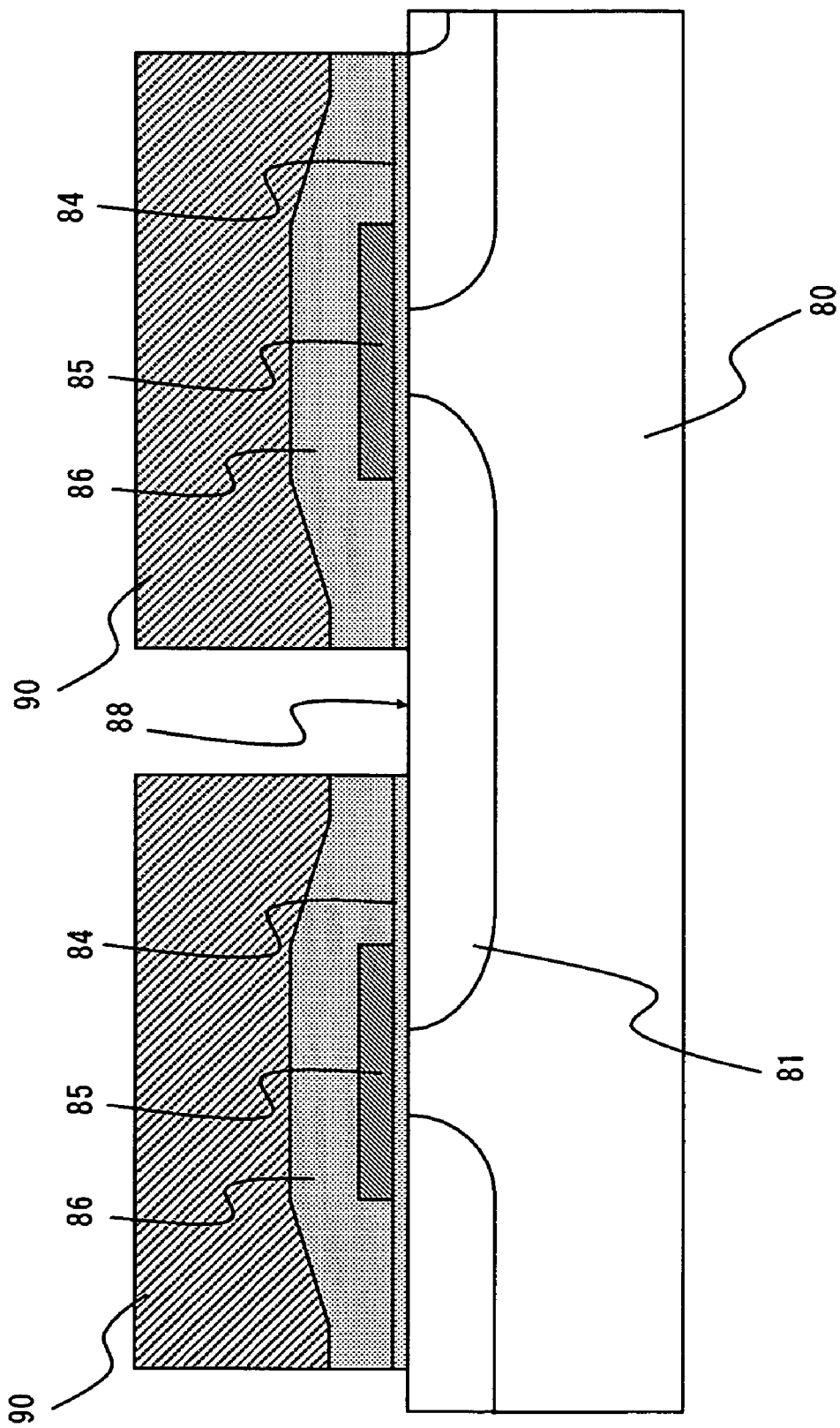
FIG. 11 is a cross-sectional diagram for explaining a manufacturing method of the semiconductor apparatus according to a conventional technique.
Figure 12:
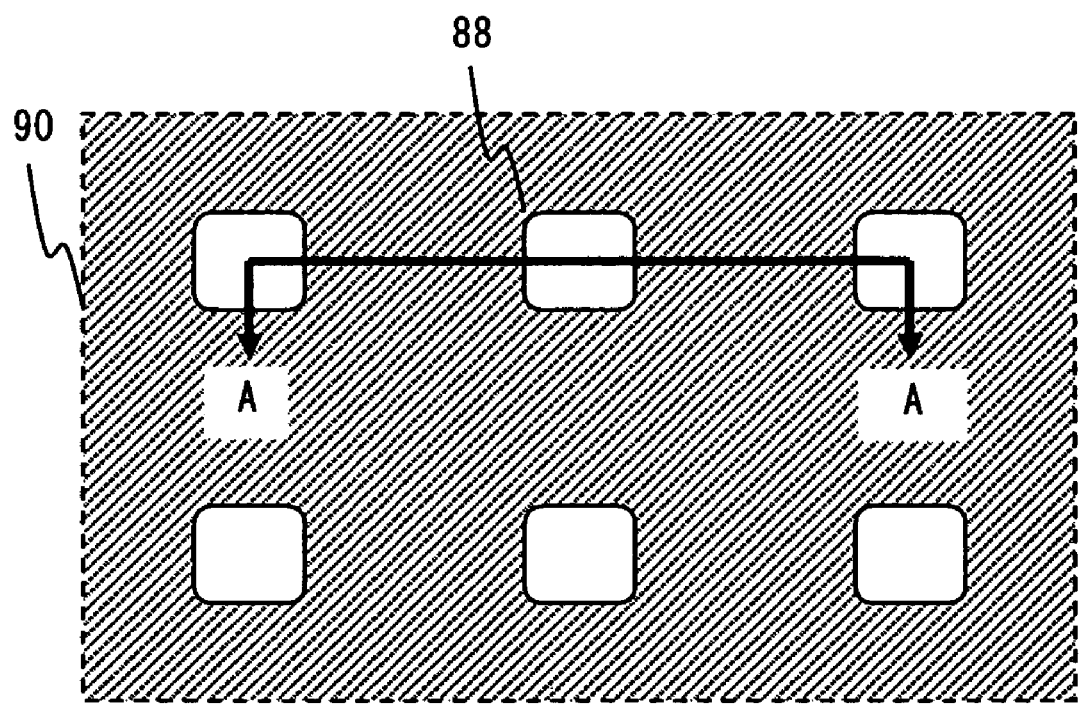
FIG. 12 is a plan view for explaining a manufacturing method of the semiconductor apparatus according to a conventional technique.
Figure 13:
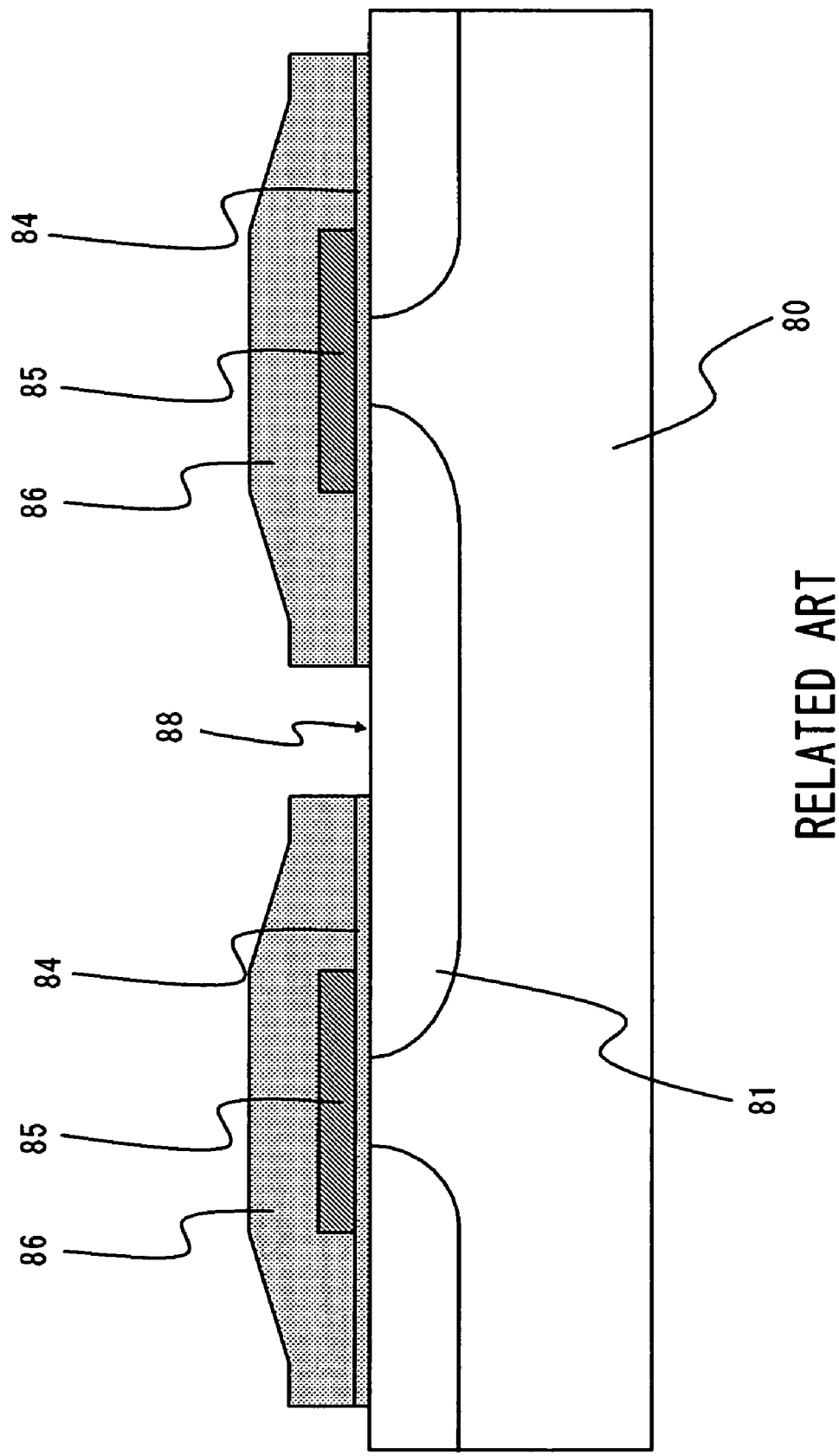
FIG. 13 is a cross-sectional diagram for explaining a manufacturing method of the semiconductor apparatus according to a conventional technique.
Figure 14:
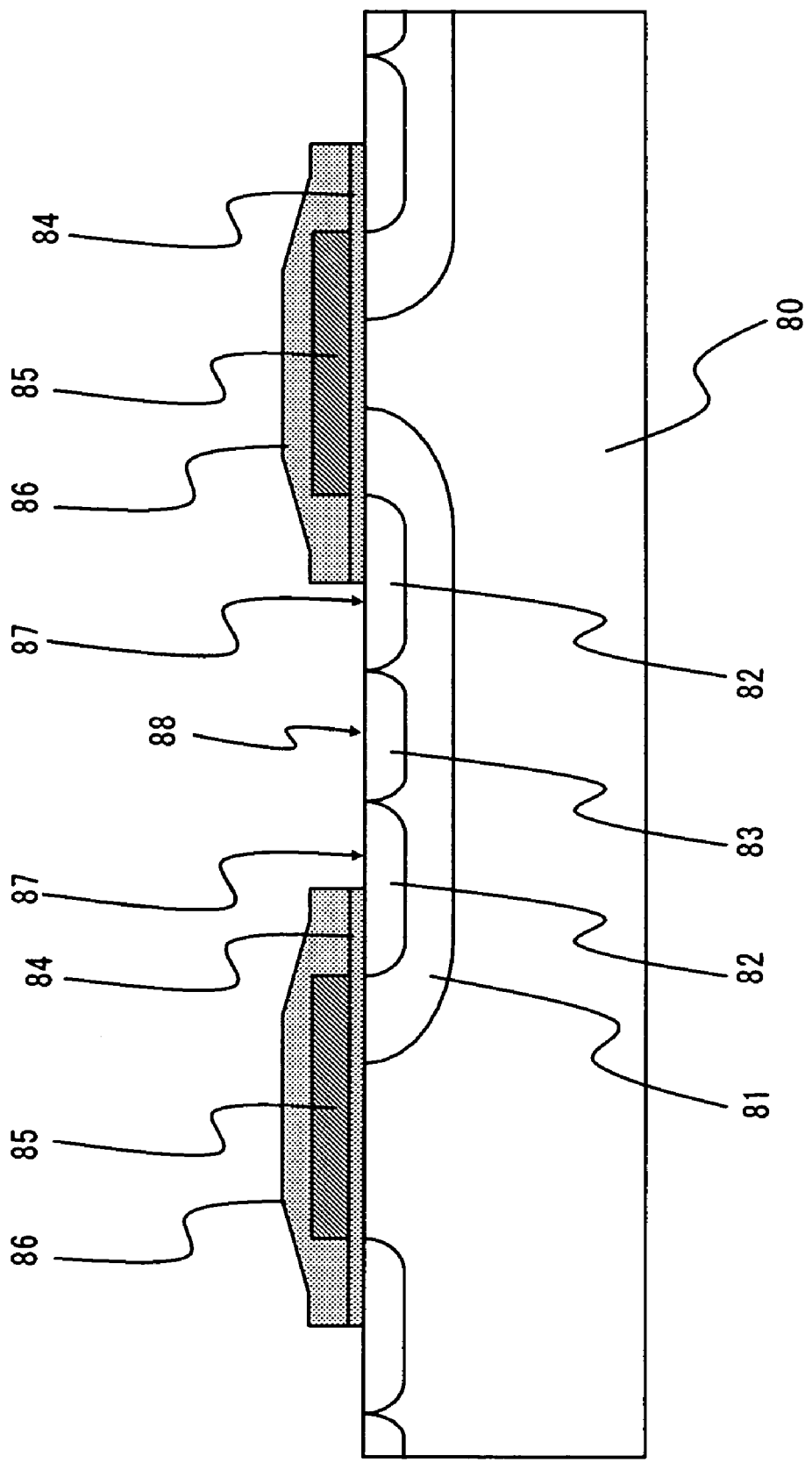
FIG. 14 is a cross-sectional diagram for explaining a manufacturing method of the semiconductor apparatus according to a conventional technique.
Figure 15:
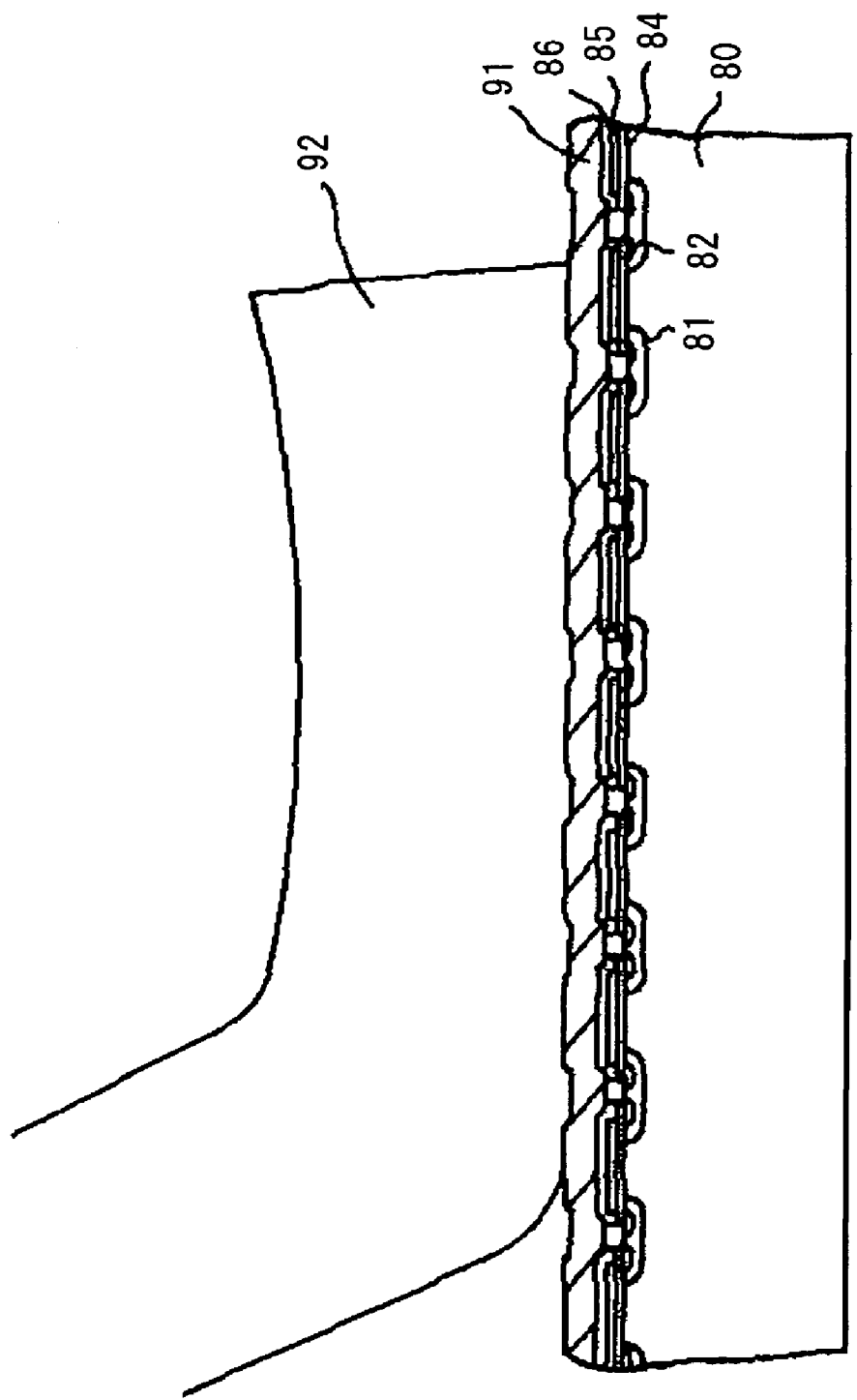
FIG. 15 is a cross-sectional diagram showing a manufacturing method of the semiconductor apparatus according to a conventional technique.

FIGS. 8 and 9 show a manufacturing method of a semiconductor apparatus according to the present invention. FIG. 8 corresponds to FIG. 3 of the first embodiment. FIG. 9 corresponds to FIG. 4 of the first embodiment.

As shown in FIG. 8, the trench 40 is formed in the semiconductor substrate 10, polysilicon is formed in the trench 40, and the gate electrode 15 is formed by etch back method. Then as with the first embodiment, the body diffusion layer 11 and the source diffusion layer 12 are formed, and the interlayer dielectric 16 is formed over all the surface of the semiconductor substrate 10. After that, the semiconductor substrate is patterned using the photoresist 30, an anisotropic etching is performed from the opening 31 of the photoresist 30 so as to form the body contact 22. Then ion is implanted from the opening 31 to form the body contact diffusion layer 13.

After that as shown in FIG. 9, as with the first embodiment, an isotopic etching is performed from the opening 31 of the photoresist 30 to form the source contact 21. Then the photoresist 30 is removed, the source electrode 17 and the drain electrode 18 are formed so as to complete the semiconductor apparatus of FIG. 7.

As described in the foregoing, the present invention is not restricted to a MOSFET having planar gate structure as with the first embodiment but may be applied to a MOSFET having trench gate structure. In this case also, the thickness of the interlayer dielectric does not decrease and also influence to characteristics of a MOSFET can be reduced.

In the above examples, MOSFET having planar gate and trench gate structures are explained as examples. However MOSFET having other gate structure such as V-groove may be applied. Furthermore MOSFET is explained as an example here, MISFET (Metal Insulator Semiconductor Field Effect Transistor), IGFET (Insulated Gate Field Effect Transistor), or IGBT (Insulated Gate Bipolar Transistor) may be used.

In the above examples, a heat treatment is applied after implanting ion to the diffusion layer. However the heat treatment may be applied at other timings. For example the source diffusion layer may be formed by a heat treatment after implanting ion to the body contact diffusion layer.

It is apparent that the present invention is not limited to the above embodiment and it may be modified and changed without departing from the scope and spirit of the invention.

What is claimed is:

1. A method of manufacturing a semiconductor apparatus, comprising:
    forming a low-density body region of a second conductivity type in a surface of a semiconductor substrate of a first conductivity type;
    forming a source region of the first conductivity type in the body region;
    forming a gate electrode adjacent to the body region via a gate insulating film;
    forming an interlayer dielectric over the body region and the gate electrode;
    forming a mask pattern over the interlayer dielectric;
    forming an opening in the interlayer dielectric using the mask pattern as a mask;
    implanting ions to a region of the body region using the mask pattern as a mask to form a high-density body contact region of the second conductivity type; and
    removing the interlayer dielectric to extend the opening of the interlayer dielectric using the mask pattern as a mask to form a source contact,
    wherein an entire surface of the source region and an entire top surface of the body contact region that is formed by said implantating are leveled with a substantially coplanar surface of the semiconductor substrate.

2. The method of manufacturing a semiconductor apparatus according to claim 1, wherein the source contact is formed by performing an isotropic etching to remove the interlayer dielectric for a wider range than an opening of the mask pattern.

3. The method of manufacturing a semiconductor apparatus according to claim 1, wherein the body contact region is formed by implanting an ion after performing an anisotropic etching to remove the interlayer dielectric for almost the same range as the opening of the mask pattern.

4. The method of manufacturing a semiconductor apparatus according to claim 2, wherein the source contact is formed by removing the gate insulating film for the same range as the interlayer dielectric to be removed.

5. The method of manufacturing a semiconductor apparatus according to claim 3, wherein the body contact region is formed by removing the gate insulating film for the same range as the interlayer dielectric to be removed.

6. The method of manufacturing a semiconductor apparatus according to claim 1, wherein the body contact region is formed in a central portion of the body region, and
    wherein the source contact is formed around the body contact region.

7. The method of manufacturing a semiconductor apparatus according to claim 1, wherein the gate electrode is formed in a planar shape over the gate insulating film.

8. The method of manufacturing a semiconductor apparatus according to claim 1, further comprising:
    forming a trench for penetrating the body region from the surface of the semiconductor substrate; and
    forming the gate insulating film and the gate electrode inside the trench.

9. The method of manufacturing a semiconductor apparatus according to claim 1, further comprising:

stopping an etching of the interlayer dielectric over a surface of the semiconductor substrate using the mask pattern as a mask; and forming the opening in the interlayer dielectric by said etching.

10. The method of manufacturing a semiconductor apparatus according to claim 1, wherein said source region is unetched.

11. The method of manufacturing a semiconductor apparatus according to claim 1, wherein said removing of the interlayer dielectric is performed after said implanting.

12. The method of manufacturing a semiconductor apparatus according to claim 1, wherein etching from said opening forms said region of the body region for said implanting ions by using the mask pattern so that the interlayer dielectric and the gate insulating film over a central part of the low-density body region are removed to expose the low-density body region.

13. The method of manufacturing a semiconductor apparatus according to claim 1, wherein said surface of said body contact region is confined within said opening prior to said extension of the opening.

14. The method of manufacturing a semiconductor apparatus according to claim 1, wherein said body contact region is formed within said opening prior to said extension of the opening.

15. The method of manufacturing a semiconductor apparatus according to claim 1, wherein said body contact region is other than overlapping and is not forming adjacent to said gate insulating film.

16. The method of manufacturing a semiconductor apparatus according to claim 1, wherein said source region separates said body contact region from said gate insulating film.

17. The method of manufacturing a semiconductor apparatus according to claim 1, wherein said source contact covers said entire surface of said body contact region.

18. The method of manufacturing a semiconductor apparatus according to claim 1, wherein said source contact extends within an entire surface of said extended opening of the interlayer dielectric.

19. A method of manufacturing a semiconductor apparatus comprising:

forming a low-density body region of a second conductivity type in a surface of a semiconductor substrate of a first conductivity type;

forming a source region of the first conductivity type in the body region;

forming a gate electrode adjacent to the body region via a gate insulating film, after said forming a gate electrode;

forming an interlayer dielectric over the body region and the gate electrode;

forming a mask pattern over the interlayer dielectric;

forming an opening in the interlayer dielectric using the mask pattern as a mask by etching said interlayer dielectric until said opening reaches said surface of the semiconductor substrate;

implanting ions to a region of the body region using the mask pattern as a mask to form a high-density body contact region of the second conductivity type; and removing the interlayer dielectric to extend the opening of the interlayer dielectric using the mask pattern as a mask to form a source contact, after said implanting, wherein an entire top surface of the source region and an entire top surface of the body contact region are leveled with a substantially coplanar surface of the semiconductor substrate, and wherein said source region separates said body contact region from said gate insulating film.

* * * * *